United States Patent
Yoshikawa et al.

(10) Patent No.: US 7,098,488 B2
(45) Date of Patent: Aug. 29, 2006

(54) INSULATED GATE BIPOLAR TRANSISTOR

(75) Inventors: Koh Yoshikawa, Nagano (JP); Katsunori Ueno, Nagano (JP); Hiroshi Kanemaru, Nagano (JP)

(73) Assignee: Fuji Electric Holdings Co., Ltd., (JP)

(*) Notice: Subject to any disclaimer, the term of this patent is extended or adjusted under 35 U.S.C. 154(b) by 123 days.

(21) Appl. No.: 10/839,791

(22) Filed: May 5, 2004

(65) Prior Publication Data
US 2005/0045945 A1    Mar. 3, 2005

(30) Foreign Application Priority Data
May 7, 2003  (JP)  ............... 2003-129243

(51) Int. Cl.
*H01L 29/73* (2006.01)
(52) U.S. Cl. ............... 257/176; 257/173; 257/355; 257/356
(58) Field of Classification Search .......... 257/176, 257/E29.335
See application file for complete search history.

(56) References Cited

U.S. PATENT DOCUMENTS

| | | | |
|---|---|---|---|
| 5,266,831 A * | 11/1993 | Phipps et al. ............... | 257/620 |
| 5,502,338 A * | 3/1996 | Suda et al. ............... | 257/570 |
| 5,973,359 A * | 10/1999 | Kobayashi et al. ............... | 257/328 |
| 6,111,290 A | 8/2000 | Uenishi et al. ............... | 257/331 |
| 6,114,727 A | 9/2000 | Ogura et al. ............... | 257/342 |
| 6,188,109 B1 * | 2/2001 | Takahashi ............... | 257/355 |
| 6,246,092 B1 * | 6/2001 | Fujihira et al. ............... | 257/341 |
| 6,580,121 B1 * | 6/2003 | Hisamoto ............... | 257/328 |
| 6,737,705 B1 | 5/2004 | Momota et al. | |
| 6,762,440 B1 * | 7/2004 | Pairitsch et al. ............... | 257/173 |
| 6,762,461 B1 * | 7/2004 | Kawamoto ............... | 257/358 |
| 6,912,153 B1 * | 6/2005 | Tihanyi ............... | 365/158 |
| 2002/0050603 A1 * | 5/2002 | Kawamoto ............... | 257/175 |

FOREIGN PATENT DOCUMENTS

| | | |
|---|---|---|
| JP | 2-102579 | 4/1990 |
| JP | 5-175491 | 7/1993 |
| JP | 5-243561 | 9/1993 |
| JP | 8-505008 | 5/1996 |
| JP | 2000-183340 | 6/2000 |
| JP | 2001-308327 | 11/2001 |
| JP | 3325424 | 7/2002 |

* cited by examiner

Primary Examiner—Kenneth Parker
Assistant Examiner—José R. Díaz
(74) Attorney, Agent, or Firm—Rossi, Kimms & McDowell LLP (57) ABSTRACT

An IGBT having a trench gate structure is disclosed which generates decreased noise at switching and displays superiority in saturation voltage to turn-off loss characteristics (trade-off characteristics). In a part of a region on an emitter side surface interposed between trench gates, a sub well region is provided, which is connected to an emitter electrode through diodes. When the IGBT is in a turned-on state, the diodes are brought into a non-conduction state to isolate the sub well region from the emitter electrode, by which carriers are accumulated. When the IGBT is in a turned-off state, the diodes are brought into a conduction state to electrically connect the sub well region to the emitter electrode, by which carriers are discharged at a high speed. In an early stage of turning-on of the IGBT, capacitance of a portion of the gate facing the sub well region is converted to gate-emitter capacitance to thereby reduce gate-collector capacitance, by which electromagnetic noise at switching is reduced.

21 Claims, 10 Drawing Sheets

INSULATED GATE BIPOLAR TRANSISTOR

This application claims priority from Japanese application JP PA 2003-129243, filed on May 7, 2003, the contents of which are incorporated by reference herein in their entirety.

BACKGROUND OF THE INVENTION

A. Field of the Invention

The present invention relates to an insulated gate bipolar transistor, and more particularly to an insulated gate bipolar transistor having a trench structure in which a gate electrode is buried in a trench formed in a semiconductor substrate with a gate insulator film interposed between.

B. Description of the Related Art

In recent years, under the leadership of Europe and North America, restrictions have been placed on electromagnetic noise generated from semiconductor apparatus provided with power semiconductor devices. It is known that the electromagnetic noise is generated due to variation in a voltage V with respect to time t (hereinafter represented as dV/dt) or variation in a current I with respect to time t (hereinafter represented as dI/dt) when the power semiconductor device is subjected to switching. Therefore, for reducing the electromagnetic noise, it is required to lower dV/dt or dI/dt during switching.

In a power semiconductor device such as an insulated gate bipolar transistor (hereinafter referred to as an "IGBT"), it is known that the relationship between saturation voltage and switching (turn-off) loss necessitates a trade-off. The saturation voltage to turn-off loss characteristics of necessitating a trade-off (hereinafter simply referred to as "trade-off characteristics") become indices in evaluating a generated loss of a power semiconductor device.

Some effective measures for improving such trade-off characteristics have been proposed, such as increasing a carrier concentration near the surface of a power semiconductor device (for example, see JP-A-5-243561 (FIG. 101) and JP-A-2001-308327). In these techniques, a contact area of a semiconductor with an emitter electrode is decreased to increase a hole concentration in a base region, by which an IGBT with a lowered saturation voltage is realized. In the IGBT with such a structure, when the device is turned-on, carriers accumulate in a neighborhood of a region where the surface of the semiconductor is not in contact with the emitter electrode in a region interposed between trench structures.

Moreover, a semiconductor device with a structure in which a part of a gate insulator film is thickened is publicly known (for example, see Japanese Patent No. 3,325,424 or JP-A-2-102579). With such a structure, by thickening a portion of a gate insulator film contributing to gate-collector capacitance (hereinafter referred to as "GC capacitance") more than the other portion, a portion contributing to gate-emitter capacitance (hereinafter referred to as "GE capacitance"), the GC capacitance can be made small. The GC capacitance and the GE capacitance make up gate capacitance.

Furthermore, in a lateral planer gate IGBT, there is publicly known one with a structure in which a P region is formed adjacent to a cathode side base zone so as to be separately positioned in an anode side n-base zone and the P region is connected to the cathode through a device having a non-linear current-voltage characteristic (for example, see JP-T-8-505008). According to this disclosure, such a structure is capable of enlarging a safe operating area (SOA) of the IGBT.

However, as disclosed in JP-A-5-243561 (FIG. 101) and JP-A-2001-308327, in the IGBT with the structure in which a carrier concentration near the surface is increased, gate capacitance near a region where carriers are accumulated when the IGBT is in conduction becomes GC capacitance. This results in an increase in the GC capacitance. Reduction in gate resistance for reducing a switching loss causes an increase in a rising speed of a gate voltage (charging speed of the GC capacitance) in an early stage of turning-on of the IGBT. This increases dI/dt of the IGBT and dV/dt of a diode in an opposing arm at turning-on of the IGBT. That is, there is a problem of increasing electromagnetic noise.

In addition, there is also a problem in that the small contact area of the semiconductor surface with the emitter electrode prevents carriers being swept out at turning-off of the IGBT to result in a large turn-off loss.

Furthermore, as is disclosed in Japanese Patent No. 3,325,424 or JP-A-2-102579, the thickening of a part of the gate oxide film causes problems of making the manufacturing method complicated and, in addition to this, of requiring a high processing accuracy.

The present invention is directed to overcoming or at least reducing the effects of one or more of the problems set forth above.

SUMMARY OF THE INVENTION

It is therefore and object of the invention to provide an IGBT having a trench gate structure in which electromagnetic noise at switching is so small that it provides excellent trade-off characteristics.

To achieve these and other objects, an insulated gate bipolar transistor is provided that comprises a semiconductor substrate of a first conduction type; a gate electrode provided in each of a plurality of trenches with an insulator film interposed between, the trenches being provided on a first principal surface side of the semiconductor substrate; a main well region of a second conduction type provided on the first principal surface side of the semiconductor substrate, the main well region having a depth that is less than the depth of the trench; a source region of the first conduction type selectively provided on a surface region of the main well region; an emitter electrode electrically connected to both of the source region and the main well region; a sub well region of a second conduction type provided in a region which is other than the main well region and interposed between the trenches on the first principal surface side, the sub well region having a depth that is less than the depth of the trench; a collector layer of the second conduction type formed on a second principal surface side of the semiconductor substrate; a collector electrode electrically connected to the collector layer; and a switching unit provided on the first principal surface of the semiconductor substrate and between the sub well region and the emitter electrode, the switching unit isolating the sub well region from the emitter electrode when a forward collector-emitter voltage is low and connecting the sub well region to the emitter electrode when the forward collector-emitter voltage is high.

In one embodiment, the main well region and the sub well region are separated from each other with the trench interposed between them. Moreover, the switching unit can be formed of at least one diode, the sub well region side of which is the second conduction type, and the emitter electrode side of which is the first conduction type. In this case, the diode can be formed of polysilicon of the first conduction type and polysilicon of the second conduction type which are provided on the semiconductor substrate in a direct way or in an indirect way with an insulator film put between the diode and the semiconductor substrate. provided on the semiconductor substrate in a direct way or in an indirect way with an insulator film put between the diode and the semiconductor substrate.

Moreover, a built-in potential of the diode can be larger than the built-in potential of the p-n junction of silicon, and smaller than an absolute value of a voltage applied to the gate electrode. For such a diode, there can be used a diode which is formed of a silicon carbide thin film or a diamond thin film of the first conduction type and a silicon carbide thin film or a diamond thin film of the second conduction type which are provided on the semiconductor substrate in a direct way or in an indirect way with an insulator film put between the diode and the semiconductor substrate.

Furthermore, the switching unit can be formed of at least one diode, the sub well region side of which is the first conduction type, and the emitter electrode side of which is the second conduction type, for example, a Zener diode. In this case, a breakdown voltage of the diode is smaller than an absolute value of a voltage applied to the gate electrode. In addition, the Zener diode can be formed of polysilicon of the first conduction type and polysilicon of the second conduction type which are provided on the semiconductor substrate in a direct way or in an indirect way with an insulator film put between the diode and the semiconductor substrate.

According to the invention, when the first conduction type is taken as, for example, an n-type, a diode is to be disposed whose positive electrode is connected to the sub well region and whose negative electrode is connected to the emitter electrode. This makes, at a turned-on state of the IGBT, a potential of the sub well region lower than the built-in potential of the diode to bring the diode to be in a non-conduction state. Thus, the sub well region is brought into a state of being isolated from the emitter electrode. This makes capacitance of a portion of the gate facing the sub well region become the GC capacitance. However, a contact area of the semiconductor surface with the emitter electrode becomes so small that it induces an accumulation effect of carriers to lower a saturation voltage.

Meanwhile, at a turned-off state of the IGBT, the potential of the sub well region becomes higher than the built-in potential of the diode to bring the diode into a conduction state. Thus, the sub well region is electrically connected to the emitter electrode. This makes the capacitance of the portion of the gate facing the sub well region become the GE capacitance. Therefore, in an early stage of turning-on of the IGBT, the GE capacitance is increased to make the charging speed of the GE capacitance slow, by which dI/dt is reduced to reduce the electromagnetic noise. Moreover, with the diode being in continuity when the IGBT is in a turned-off state, the contact area of the semiconductor surface with the emitter electrode increases to cause the carrier to be swept out at a high speed, which makes the turn-off loss small. Also in the case in which the first conduction type is the p-type, the same is true.

Moreover, when the first conduction type is taken as, for example, the n-type, in the case in which a diode is disposed whose negative electrode is connected to the sub well region and whose positive electrode is connected to the emitter electrode, the same is also true. In this case, when the IGBT is in a turned-on state, the potential of the sub well region becomes lower than a breakdown voltage of the diode, which results in the sub well region being isolated from the emitter electrode. Furthermore, when the IGBT is in a turned-off state, the potential of the sub well region becomes higher than the breakdown voltage of the diode, which results in the sub well region being electrically connected to the emitter electrode. The same is true in the case in which the first conduction type is the p-type.

In this way, the present invention is characterized in that a part of the GC capacitance is converted to the GE capacitance at the turning-on of the IGBT so that suppressed dI/dt and dV/dt at the switching and a lowered saturation voltage are compatible with each other. Compared with this, an object of the IGBT disclosed in JP-T-8-505008 is to enlarge a safe operating area (SOA), and no reference is made to suppressing dI/dt and dV/dt at the switching. Furthermore, about the IGBT disclosed in JP-T-8-505008, no description is given to the conversion of a part of the GC capacitance to the GE capacitance at turning-on of the IGBT.

BRIEF DESCRIPTION OF THE DRAWINGS

The foregoing advantages and features of the invention will become apparent upon reference to the following detailed description and the accompanying drawings, of which.

DETAILED DESCRIPTION OF PREFERRED EMBODIMENTS

In the following, explanations will be made in detail about the modes for carrying out the invention with reference to drawings. Here, the explanations will be made about examples in each of which the invention is applied to a field stop IGBT (hereinafter referred to as an "FS-IGBT") with a structure in which an FZ substrate is used for a semiconductor substrate and, between a drift layer and a collector layer both formed of the substrate, an n-type impurity diffusion layer with a sufficient amount of dose for stopping expansion of an electric field at turning-off is provided as a buffer layer for stopping expansion of the electric field at turning-off.

Figure 1:
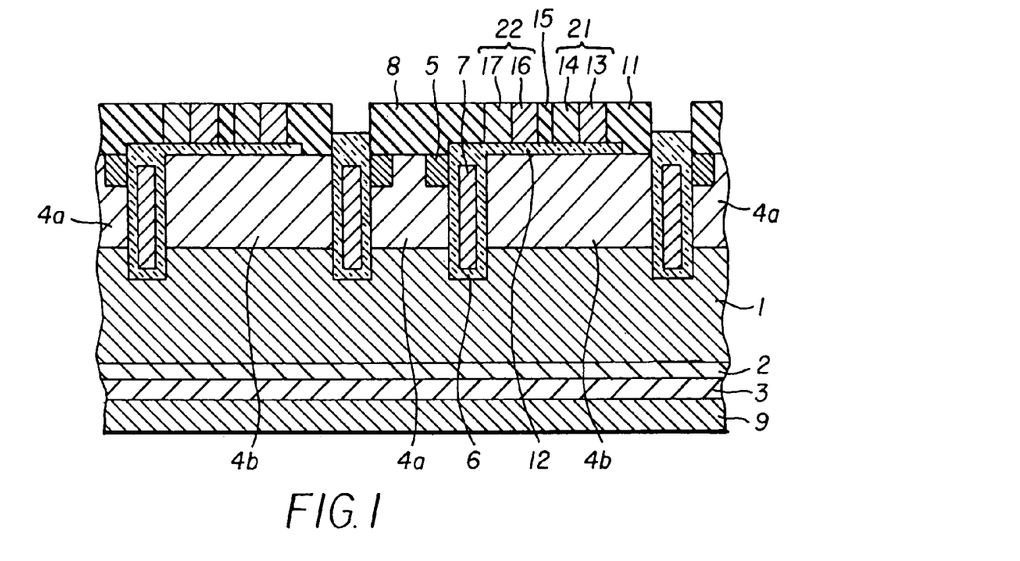
FIG. 1 is a vertical cross sectional view showing an example of an IGBT according to the invention.

FIG. 1 is a vertical cross sectional view showing an example of an FS-IGBT according to the invention. As shown in FIG. 1, on the surface of n-type semiconductor substrate 1, p-type well regions 4a and 4b are formed. A plurality of trenches penetrates through the well regions 4a and 4b from the surface of the substrate to a section to become a drift layer in semiconductor substrate 1.

One well region (a main well region) 4a and the other well region (a sub well region) 4b of well regions 4a and 4b are separated by a trench. Sub well region 4b is disposed so as to be interposed between main well regions 4a. Inside each of the trenches, gate oxide film 6 is formed as an insulator film, the inside of which is filled with gate electrode 7.

In main well region 4a, n-type source region 5 is formed on each side section of the trench. On the surface of main well region 4a, emitter electrode 8 is provided. Emitter electrode 8 is in contact with both source region 5 and main well region 4a. Auxiliary electrode 11 is in contact with sub well region 4b.

A section of sub well region 4b between auxiliary electrode 11 and emitter electrode 8 is covered with oxide film 12. Between auxiliary electrode 11 and emitter electrode 8 on oxide film 12, there are provided in order from the auxiliary electrode 11 to the emitter electrode, for example, first p-type polysilicon 13, first n-type polysilicon 14 forming a p-n junction with the first p-type polysilicon 13, conduction section 15, second p-type polysilicon 16, and second n-type polysilicon 17 forming a p-n junction with second p-type polysilicon 16.

First p-type polysilicon 13 and first n-type polysilicon 14 make up first diode 21 forming a part of a switching unit. Moreover, second p-type polysilicon 16 and second n-type polysilicon 17 make up second diode 22 forming the switching unit together with first diode 21. First p-type polysilicon 13 is in contact with auxiliary electrode 11. Second n-type polysilicon 17 is in contact with emitter electrode 8.

Conduction section 15 is in contact with first n-type polysilicon 14 and second p-type polysilicon 16. Conduction section 15 is provided for preventing second p-type polysilicon 16 and first n-type polysilicon 14 from coming in direct contact with each other to form a p-n junction.

Namely, an arrangement is provided in which first diode 21 and second diode 22, each taking the side of auxiliary electrode 11 and the side of emitter electrode 8 as the positive electrode side and the negative electrode side, respectively, are connected in series between auxiliary electrode 11 and emitter electrode 8. For convenience in explanation, in FIG. 1, polysilicon 13, 14, 16, 17 and conduction section 15 are shown arranged in the lateral direction to the paper. They, however, are actually arranged in the vertical direction to the paper.

When an arrangement is provided with three or more diodes connected in series between auxiliary electrode 11 and emitter electrode 8, some combinations each including conduction section 15, second p-type polysilicon 16 and second n-type polysilicon 17 can be inserted as necessary. When the sufficient number of the diode is one, an arrangement can be provided without conduction section 15, second p-type polysilicon 16 and second n-type polysilicon 17.

On the bottom surface of semiconductor substrate 1, n-type buffer layer 2 and p-type collector layer 3 are formed. On the surface of collector layer 3, that is, on the bottom surface of the substrate, collector electrode 9 is formed.

Here, a built-in potential of the diode elements (a series connection of the first and second diodes 21 and 22 in FIG. 1) is higher than the built-in potential of the p-n junction of silicon, but smaller than an absolute value of a voltage applied to gate electrode 7. The reason is as follows.

A small amount of electric potential variation (amount of rise) in a region facing a portion of the gate in sub well region 4b (hereinafter the region is referred to as a "specified region") causes a charging speed of the GE capacitance to slow and this makes dI/dt small. Namely, for reducing electromagnetic noise, a smaller amount of electric potential rise in the specified region during turning-on is better suited.

Moreover, with the amount of electric potential rise in the specified region smaller than the amount of electric potential rise when the well region is electrically floated, an improving effect of the electromagnetic noise reduction is obtained. The amount of electric potential rise in the floated well region is of the order of a voltage of the gate electrode. Therefore, the built-in voltage (in the forward direction) of the diode element should be adjusted so as to become smaller than the voltage applied to the gate electrode.

Furthermore, sub well region 4b is formed at such a position that the voltage of sub well region 4b varies in compliance with the collector-emitter voltage, namely, a position where the voltage of sub well region 4b becomes high when the collector-emitter voltage is high, that is, when the IGBT is in a turned-off state, and becomes low when the collector-emitter voltage is low, that is, when the IGBT is in a turned-on state. Furthermore, the diode element is better provided with a built-in potential (in the forward direction) that is low to an extent that an accumulation effect of carriers is not inhibited when the IGBT is in a turned-on state.

Here, by changing the number of the diodes connected in series or the built-in potential of each diode, the built-in potential of the diode element can be adjusted. Moreover, by adequately selecting substrate materials of the diodes, the built-in potential of each diode element can be varied.

Figure 2:
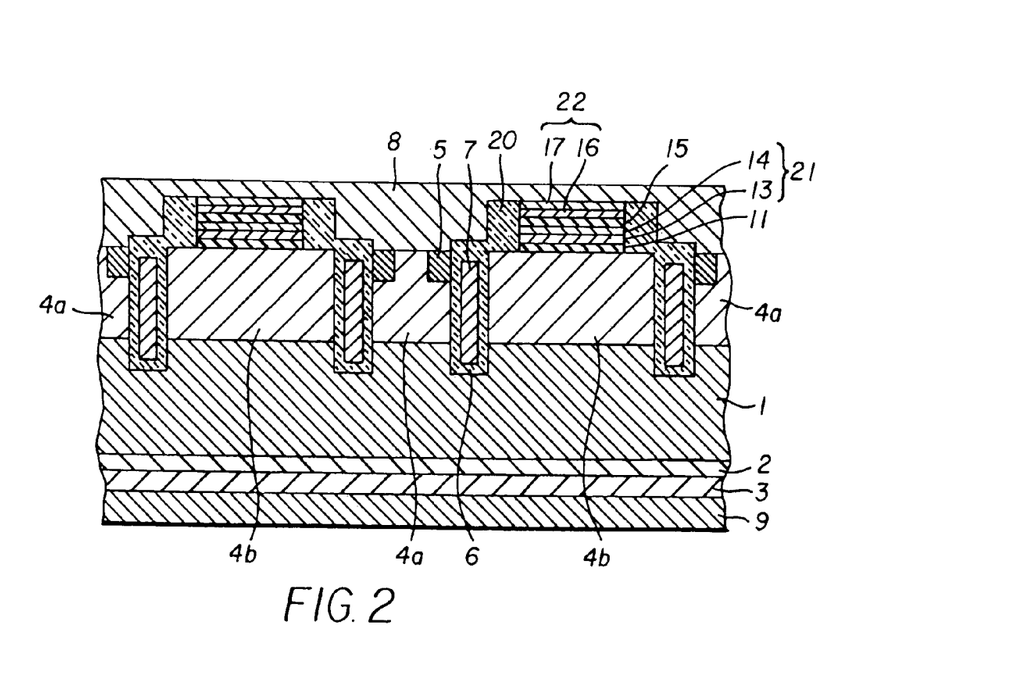
FIG. 2 is a vertical cross sectional view showing another example of an IGBT according to the invention.

FIG. 2 is a vertical cross sectional view showing another example of the FS-IGBT according to the invention. The FS-IGBT shown in FIG. 2 is one with an arrangement in which auxiliary electrode 11, first p-type polysilicon 13, first n-type polysilicon 14, conduction section 15, second p-type polysilicon 16 and second n-type polysilicon 17 are laminated in this order on the surface of sub well region 4b with emitter electrode 8 covering second n-type polysilicon 17.

Namely, first and second diodes 21 and 22 are connected in series in the thickness direction. Auxiliary electrode 11, first p-type polysilicon 13, first n-type polysilicon 14, conduction section 15 and second p-type polysilicon 16 are insulated from emitter electrode 8 by two oxide films 20. The other arrangements are the same as those of the IGBT shown in FIG. 1. Thus, corresponding constituents are denoted with the same reference numerals and signs with explanations thereof being omitted.

Figure 3:
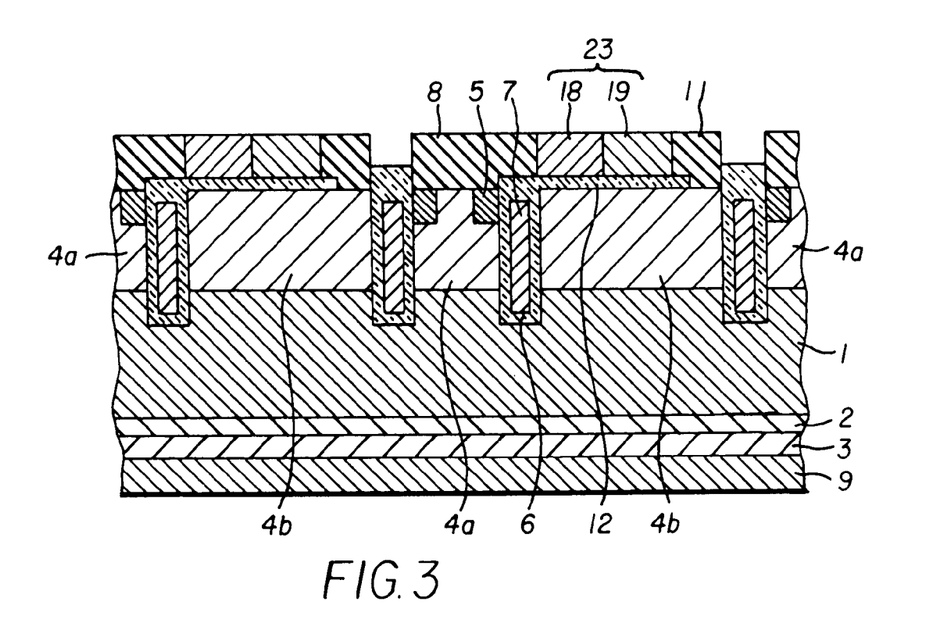
FIG. 3 is a vertical cross sectional view showing another example of an IGBT according to the invention.

FIG. 3 is a vertical cross sectional view showing another example of the FS-IGBT according to the invention. In the FS-IGBT shown in FIG. 3 there are provided p-type polysilicon 18 in contact with emitter electrode 8 and n-type polysilicon 19 forming a p-n junction with p-type polysilicon 18 and being in contact with auxiliary electrode 11. P-type polysilicon 18 and n-type polysilicon 19 make up diode 23 forming a part of a switching unit.

In the case of the arrangement shown in FIG. 3, by changing the breakdown voltage of diode 23, a potential with which sub well region 4b is isolated from emitter electrode 8, or a potential with which sub well region 4b is electrically connected to emitter electrode 8 is adjusted. The value of the breakdown voltage of diode 23 is smaller than an absolute value of a voltage applied to gate electrode 7. Moreover, for minimizing an amount of variation in the electric potential in sub well region 4b by a current flowing in diode 23, diode 23 is desirably formed with a Zener diode.

Figure 10:
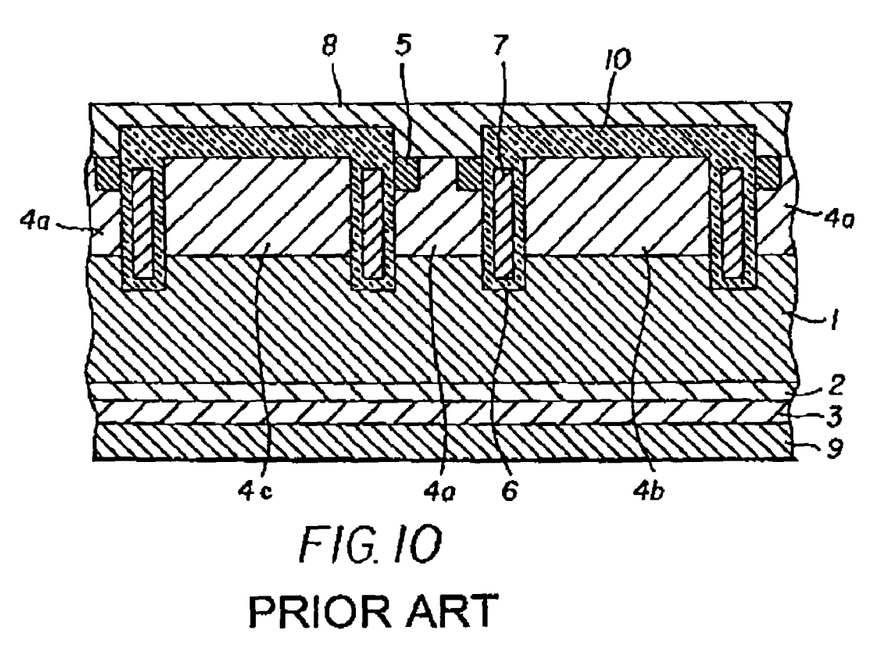
FIG. 10 is a vertical cross sectional view showing a conventional IGBT.

Next, explanations will be made about results of comparison of characteristics between the IGBT with the arrangement shown in FIG. 1 and a conventional FS-IGBT with an arrangement shown in FIG. 10. As shown in FIG. 10, the conventional IGBT has an arrangement in which, instead of sub well region 4b as in the IGBT of FIG. 1, p-type floating region 4c is provided, the surface of which is covered with oxide film 10. Moreover, as a matter of course, the conventional IGBT is provided with no auxiliary electrode 11 and no diodes 21 and 22.

In the IGBT with the arrangement shown in FIG. 1, one in which the number of diodes connected in series to form the switching unit is three is taken as a first example, and one in which the number of diodes connected in series to form the switching unit is two is taken as a second example. Moreover, the IGBT with the arrangement shown in FIG. 10 is taken as an example of a conventional one. Dimensions, characteristics, forms, forming methods and the like described below are common to the first example, the second example and the example of conventional device.

The class of breakdown voltage is taken as 600V. Moreover, resistivity and a thickness of semiconductor substrate 1 are taken as 30 Ωcm and 65 μm, respectively. A depth and a width of each trench are taken as 5 μm and 1 μm, respectively, and a cell pitch is taken as 16 μm. The trench is formed to be stripe-like in a horizontal pattern. Furthermore, a width of a section where the emitter electrode 8 is in contact with source region 5 and main well region 4a, that is, a width of a contact section, is 3 μm.

Buffer layer 2 and collector layer 3 are formed by carrying out ion implantation and heat treatment to semiconductor substrate 1. In the first example and the second example, diodes 21 and 22 are formed by depositing a polysilicon layer with a thickness of 1 μm on oxide film 12, and by separately implanting arsenic ions as n-type impurities and boron ions as p-type impurities to the polysilicon layer.

Figure 4:
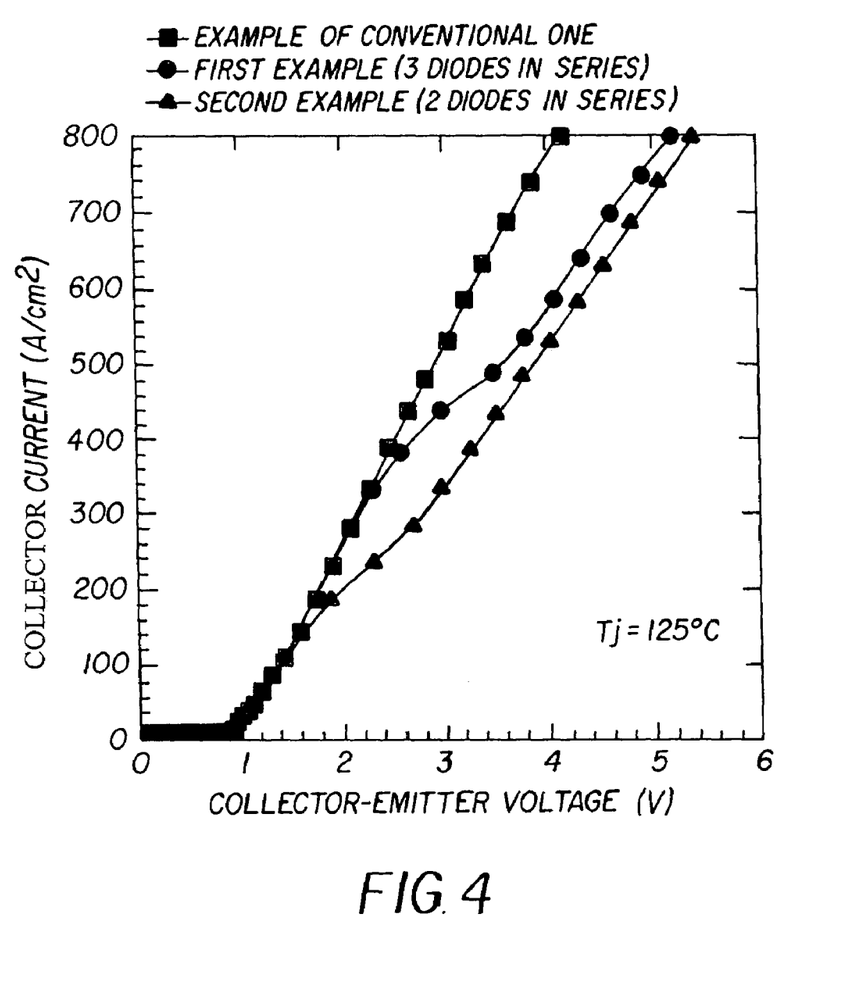
FIG. 4 is a characteristic diagram showing a result of comparison of I–V output characteristics between the IGBTs according to the invention and an IGBT with a conventional arrangement.

FIG. 4 is a characteristic diagram showing results of a comparison of collector current to collector-emitter voltage output characteristics (I–V output characteristics) for the IGBTs of the first example, the second example and the example of a conventional device. From FIG. 4, it is known that the characteristics of both of the first example and the second example are the same as that of the example of the conventional device in a range in which a current density is low, but begin to differ as the current density increases. Moreover, it is also known that the current density causing the transition of the characteristics increases with an increase in the number of the series-connected diodes. In view of the fact that a lower saturation voltage is desirable in a turned-on state and that the current density of the class 600V IGBT is currently of the order of 200 A/cm², when forming the diodes with polysilicon, it is preferable that two or three diodes are connected in series.

Figure 5:
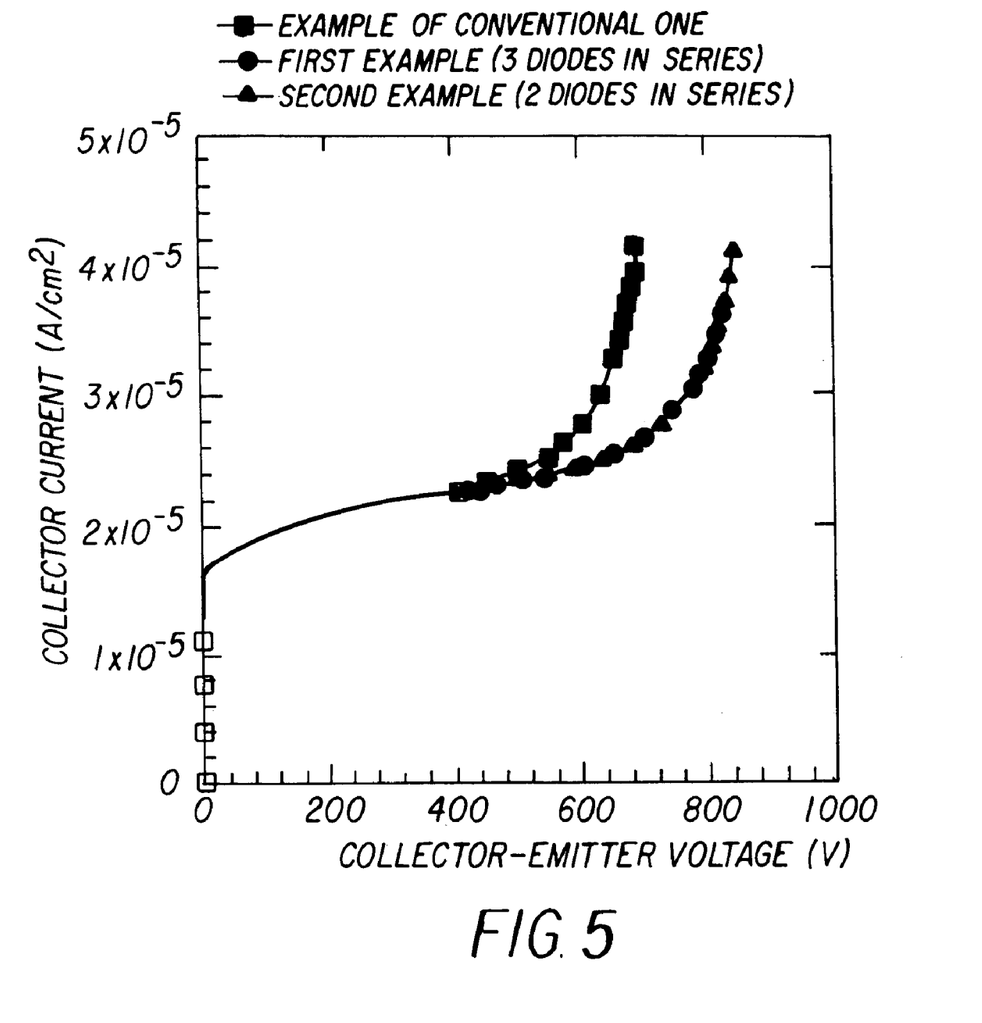
FIG. 5 is a characteristic diagram showing a result of comparison of breakdown voltage characteristics between the IGBTs according to the invention and the IGBT with the conventional arrangement.

FIG. 5 is a characteristic diagram showing results of comparison of characteristics of breakdown voltages about the IGBTs of the first example, the second example and the example of a conventional device. From FIG. 5, it is known that the IGBTs in both the first example and the second example are superior to the example of the conventional device showing degradation in breakdown voltage. This is because presence of floating region 4c in the example of the conventional IGBT causes a rise in an electric field intensity at a bottom of the trench, but in contrast with this, absence of the floating region in the first example and the second example causes no rise in the electric field strength at the bottom of the trench.

Figure 6:
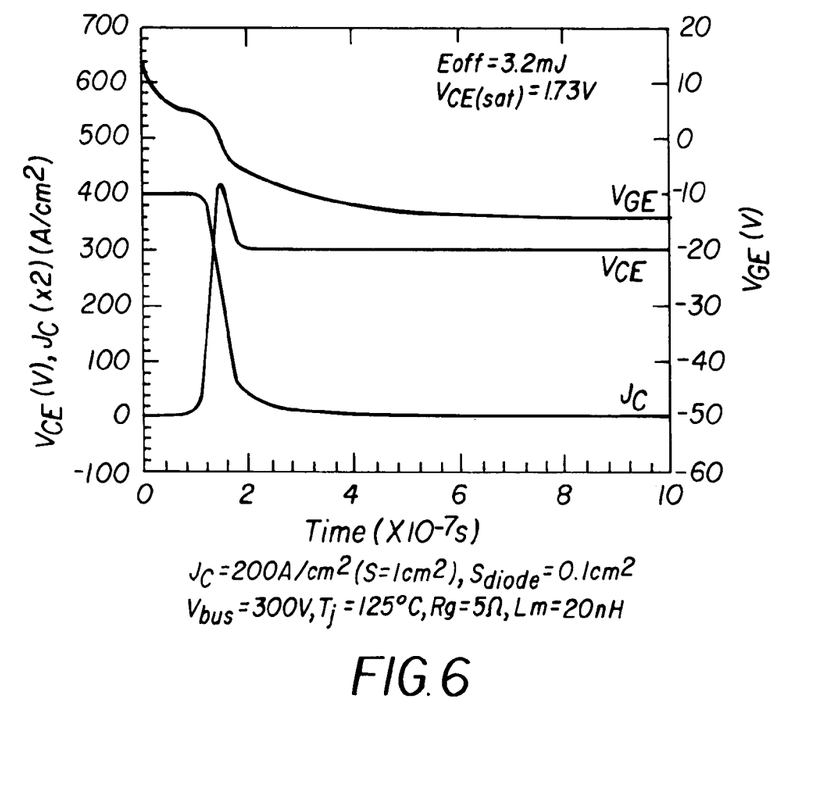
FIG. 6 is a characteristic diagram showing waveforms of $V_{GE}$, $V_{CE}$ and $I_C$ at turning-off of the IGBT according to the invention.
Figure 11:
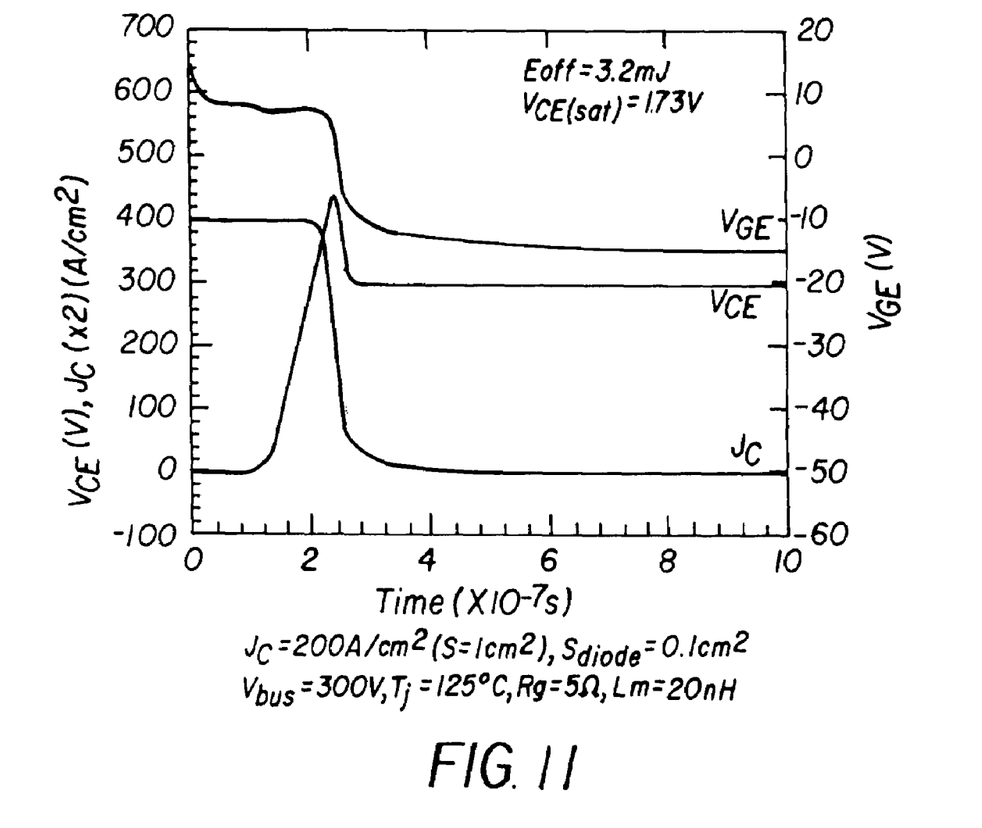
FIG. 11 is a characteristic diagram showing waveforms of $V_{GE}$, $V_{CE}$ and $I_C$ at turning-off of the conventional IGBT.

FIG. 6 is a characteristic diagram showing waveforms of the gate-emitter voltage $V_{GE}$, the collector-emitter voltage $V_{CE}$ and the collector current $I_C$ of the IGBT of the first example at turning-off. FIG. 11 is a characteristic diagram showing waveforms of the gate-emitter voltage $V_{GE}$, the collector-emitter voltage $V_{CE}$ and the collector current $I_C$ of the example of the conventional IGBT at turning-off. From a comparison of the waveforms in FIG. 6 and FIG. 11, it is known that the turning-off speed of the IGBT of the first example is faster than that of the example of the conventional device. This is because carriers are swept out only through the contact section at turning-off in the example of the conventional IGBT, but in contrast with this, in the first example, in addition to being swept out from the contact section, carriers are swept out also from sub well region 4b through diodes 21 and 22.

Figure 7:
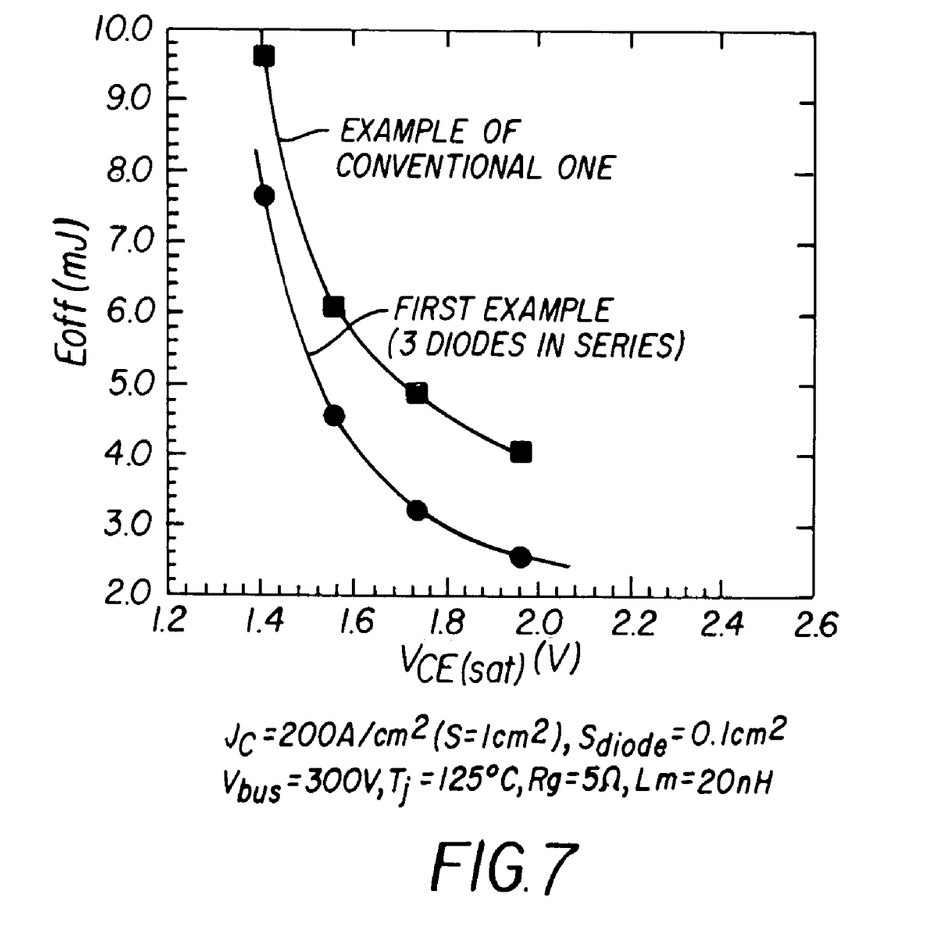
FIG. 7 is a characteristic diagram showing a result of comparison of saturation voltage $V_{CE(sat)}$ to turn-off loss $E_{off}$ characteristics as trade-off characteristics between the IGBT according to the invention and an IGBT with a conventional arrangement.

FIG. 7 is a characteristic diagram showing a result of comparison of saturation voltage $V_{CE(sat)}$ to turn-off loss $E_{off}$ characteristics as trade-off characteristics about the IGBTs of the first example and the example of conventional one. It is known from FIG. 7 that the IGBT of the first example shows low saturation voltages of the same order as those of the example of the conventional one and has more reduced turn-off losses $E_{off}$ than those of the example of the conventional one.

Figure 8:
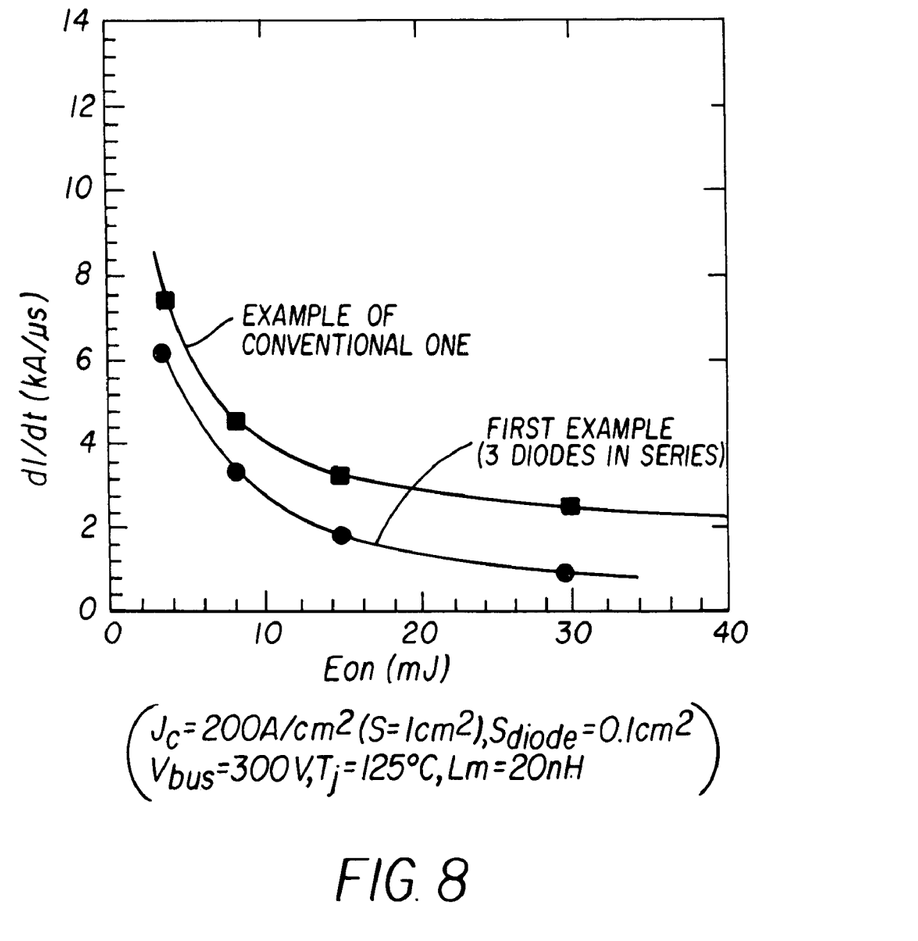
FIG. 8 is a characteristic diagram showing a result of comparison of turn-on loss $E_{on}$ to dI/dt characteristics between the IGBT according to the invention and an IGBT with a conventional arrangement.

FIG. 8 is a characteristic diagram showing results of comparison of correlations between a generated loss $E_{on}$ and dI/dt at turning-on about the IGBT of the first example and the example of the conventional device. From FIG. 8, as a result of comparison under the same condition of dI/dt, it is known that the turn-on loss $E_{on}$ of the IGBT of the first example is smaller than that of the example of the conventional one.

Figure 9:
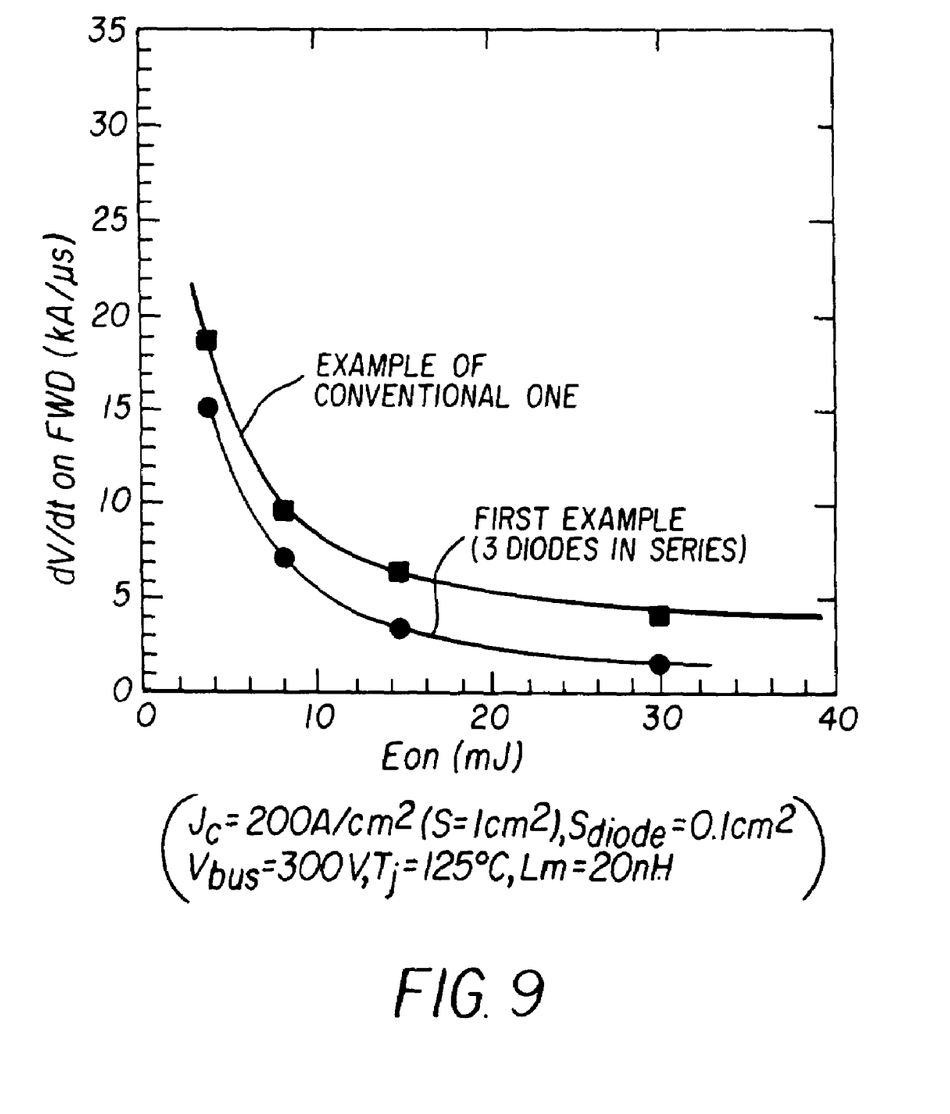
FIG. 9 is a characteristic diagram showing a result of comparison of turn-on loss $E_{on}$ to dV/dt characteristics between the IGBT according to the invention and an IGBT with a conventional arrangement.

FIG. 9 is a characteristic diagram showing results of comparison of correlations between a generated loss $E_{on}$ and dV/dt of the diode in the opposing arm at turning-on about the IGBT of the first example and the example of conventional one. From FIG. 9, as a result of comparison under the same condition of dV/dt, it is known that the turn-on loss $E_{on}$ of the IGBT of the first example is smaller than that of the example of the conventional one.

According to the above-described modes, in an early stage of turning-on of the IGBT, capacitance of a portion of the gate facing sub well region 4b is converted from the GC capacitance to the GE capacitance to thereby increase the GE capacitance. This makes a charging speed for the GE capacitance slow, by which dI/dt and dV/dt become small. Therefore, the electromagnetic noise at switching can be reduced.

Furthermore, according to the modes, when the IGBTs are in a turned-on state, diodes 21, 22, and 23 are in a non-conduction state to isolate sub well region 4b from emitter electrode 8. This reduces the contact area of the surface of the semiconductor with emitter electrode 8 to lower the saturation voltage by the accumulating effect of carriers. Meanwhile, when the IGBTs are in a turned-off state, diodes 21, 22 and 23 become in a conduction state to bring sub well region 4b into a state of being electrically connected to emitter electrode 8. This increases the contact area of the surface of the semiconductor with emitter electrode 8 so that carriers are swept out at a high speed, and the turn-off loss is decreased. Therefore a superior trade-off characteristic can be obtained with additional improvement in breakdown voltage characteristics.

In the foregoing, the invention can be variously modified without being limited to the above-described modes. For example, in the examples, the first conduction type was taken as the n-type and the second conduction type as the p-type, but the invention is similarly valid even though the conduction types are made reversed. Moreover, the above-explained dimensions, concentrations and the like are shown as those in only one example and the invention is not limited to them. Furthermore, for the semiconductor material forming diodes 21 and 22, materials other than silicon, for example, silicon carbide or diamond thin film, can be used.

In addition, sections of semiconductor such as polysilicon forming diodes 21 and 22 can be provided directly on the surface of the semiconductor substrate 1 without providing oxide film 12. Furthermore, the invention can be applied not only to the FS-IGBT but also to a punch-through type IGBT or to a non-punch-through type IGBT.

According to the invention, when the IGBT is in a turned-on state, the saturation voltage is made low by an accumulating effect of carriers. Moreover, when the IGBT is turned-off, the accumulated carriers are swept out at a high speed to reduce a turn-off loss. Furthermore, dI/dt and dV/dt during turning-on of the IGBT are small to reduce electromagnetic noise. Therefore, a trench gate structure IGBT can be obtained in which electromagnetic noise generated at switching is made small and trade-off characteristics are superior.

Thus, an insulated gate bipolar transistor has been described according to the present invention. Many modifications and variations may be made to the techniques and structures described and illustrated herein without departing from the spirit and scope of the invention. Accordingly, it should be understood that the [methods and apparatus] described herein are illustrative only and are not limiting upon the scope of the invention.

What is claimed is:

1. An insulated gate bipolar transistor comprising:
   a semiconductor substrate of a first conduction type;
   a plurality of trenches on a first principal surface side of the semiconductor substrate;
   a gate electrode provided in each of a plurality of trenches with an insulator film interposed between;
   a main well region of a second conduction type on the first principal surface side of the semiconductor substrate, the main well region having a depth that is less than the depth of the trench;
   a source region of the first conduction type selectively provided on a surface region of the main well region;
   an emitter electrode electrically connected to both of the source region and the main well region;
   a sub well region of a second conduction type provided in a region which is other than the main well region and interposed between the trenches on the first principal surface side, the sub well region having a depth that is less than the depth of the trench;
   a collector layer of the second conduction type formed on a second principal surface side of the semiconductor substrate;
   a collector electrode electrically connected to me collector layer; and
   a switching unit provided on the first principal surface of the semiconductor substrate electrically connected and between the sub well region and the emitter electrode, the switching unit isolating the sub well region from the emitter electrode when a forward collector-emitter voltage is low and connecting the sub well region to the emitter electrode when the forward collector-emitter voltage is high.

2. The insulated gate bipolar transistor as claimed in claim 1, wherein the main well region and the sub well region are provided to be separated from each other with the trench interposed between.

3. The insulated gate bipolar transistor as claimed in claim 1, wherein the switching unit is formed of at least one diode in which the side of the diode closest to the sub well region is of the second conduction type, and the side of the diode closest to the emitter electrode is of the first conduction type.

4. The insulated gate bipolar transistor as claimed in claim 2, wherein the switching unit is formed of at least one diode in which the side of the diode closest to the sub well region is of the second conduction type, and the side of the diode closest to the emitter electrode is of the first conduction type.

5. The insulated gate bipolar transistor as claimed in claim 3, wherein the diode is formed of polysilicon of the first conduction type and polysilicon of the second conduction type which are provided on the semiconductor substrate in one of a direct way and an indirect way with an insulator film put between the diode and the semiconductor substrate.

6. The insulated gate bipolar transistor as claimed in claim 4, wherein the diode is formed of polysilicon of the first conduction type and potysilicon of the second conduction type which are provided on the semiconductor substrate in one of a direct way and an indirect way with an insulator film put between the diode arid the semiconductor substrate.

7. The insulated gate bipolar transistor as claimed in claim 3, wherein a built-in potential of the diode is larger than the built-in potential of the p-n junction between the first and the second conduction types of the diode.

8. The insulated gate bipolar transistor as claimed in claim 4, wherein a built-in potential of the diode is larger than the built-in potential of the p-n junction between the first and the second conduction types of the diode.

9. The insulated gate bipolar transistor as claimed in claim 3, wherein the built-in potential of the diode is smaller than an absolute value of a voltage applied to the gate electrode.

10. The insulated gate bipolar transistor as claimed in claim 4, wherein the built-in potential of the diode is smaller than an absolute value of a voltage applied to the gate electrode.

11. The insulated gate bipolar transistor as claimed in claim 6, wherein the built-in potential of the diode is smaller than an absolute value of a voltage applied to the gate electrode.

12. The insulated gate bipolar transistor as claimed in claim 7, wherein the diode is formed of one of a silicon carbide thin film and a diamond thin film of the first conduction type and one of a silicon carbide thin film and a diamond thin film of the second conduction type which are provided on the semiconductor substrate in one of a direct way and an indirect way with an insulator film put between the diode and the semiconductor substrate.

13. The insulated gate bipolar transistor as claimed in claim 9, wherein the diode is formed of one da silicon carbide thin film and a diamond thin film of the first conduction type and one of a silicon carbide thin film and a diamond thin film of the second conduction type which are provided on the semiconductor substrate in one of a direct way and an indirect way with an insulator film put between the diode and the semiconductor substrate.

14. The insulated gate bipolar transistor as claimed in claim 1, wherein the switching unit is formed of at least one diode in which the side of the diode closest to the sub well region is of the first conduction type, and the side of the diode closest to the emitter electrode is of the second conduction type.

15. The insulated gate bipolar transistor as claimed in claim 2, wherein the switching unit is formed of at least one diode in which the side of the diode closest to the sub well region is of the first conduction type, and the side of the diode closest to the emitter electrode is of the second conduction type.

16. The insulated gate bipolar transistor as claimed in claim 14. wherein the diode is a Zener diode.

17. The insulated gate bipolar transistor as claimed in claim 15, wherein the diode is a Zener diode.

18. The insulated gate bipolar transistor as claimed in claim 16, wherein a breakdown voltage of the diode is smaller than en absolute value of a voltage applied to the gate electrode.

19. The insulated gate bipolar transistor as claimed in claim 17, wherein a breakdown voltage of the diode is smaller than an absolute value of a voltage applied to the gate electrode.

20. The insulated gate bipolar transistor as claimed in claim 16, wherein the Zener diode is formed of polysilicon of the first conduction type and polysilicon of the second conduction type which are provided on the semiconductor substrate in one of a direct way and an indirect way with an insulator film put between the diode and the semiconductor substrate.

21. The insulated gate bipolar transistor as claimed in claim 17, wherein the Zener diode is formed of polysilicon of the first conduction type and polysilicon of the second conduction type which are provided on the semiconductor substrate in one of a direct way and an indirect way with an insulator film put between the diode and the semiconductor substrate.

* * * * *